(12) United States Patent
Tian et al.

(10) Patent No.: US 8,387,560 B2
(45) Date of Patent: *Mar. 5, 2013

(54) PLASMA PROCESSING UNIT

(75) Inventors: Caizhong Tian, Amagasaki (JP);
Kiyotaka Ishibashi, Amagasaki (JP);
Junichi Kitagawa, Amagasaki (JP);
Toshihisa Nozawa, Amagasaki (JP)

(73) Assignee: Tokyo Electron Limited, Tokyo (JP)

( * ) Notice: Subject to any disclaimer, the term of this patent is extended or adjusted under 35 U.S.C. 154(b) by 1111 days.

This patent is subject to a terminal disclaimer.

(21) Appl. No.: 11/632,779

(22) PCT Filed: Jul. 21, 2005

(86) PCT No.: PCT/JP2005/013404
§ 371 (c)(1),
(2), (4) Date: Aug. 29, 2007

(87) PCT Pub. No.: WO2006/009213
PCT Pub. Date: Jan. 26, 2006

(65) Prior Publication Data
US 2008/0035058 A1    Feb. 14, 2008

(30) Foreign Application Priority Data

Jul. 23, 2004    (JP) ................. 2004-216277

(51) Int. Cl.
*C23C 16/00* (2006.01)
*C23F 1/00* (2006.01)
*H01L 21/306* (2006.01)

(52) U.S. Cl. ....... 118/723 MW; 118/723 R; 156/345.41

(58) Field of Classification Search .......... 118/723 MW, 118/723 R; 156/345.41
See application file for complete search history.

(56) References Cited

U.S. PATENT DOCUMENTS
(Continued)

FOREIGN PATENT DOCUMENTS

| AL | 05-343334 | 12/1993 |
|----|-----------|---------|
| AU | 2003241714 | * 12/2003 |

(Continued)

OTHER PUBLICATIONS

English Translation JP 2004189303, Ishii et al dated Jul. 2, 2004.*

(Continued)

*Primary Examiner* — Rakesh Dhingra
(74) *Attorney, Agent, or Firm* — Smith Gambrell & Russell, LLP

(57) ABSTRACT

The present invention provides a plasma processing unit comprising: a processing vessel having an opening on a ceiling side thereof, and capable of creating a vacuum therein; a stage disposed in the processing vessel, for placing thereon an object to be processed; a top plate made of a dielectric, the top plate being hermetically fitted in the opening and allowing a microwave to pass therethrough; a planar antenna member disposed on the top plate, the planar antenna member being provided with a plurality of microwave radiating holes for radiating a microwave for plasma generation toward an inside of the processing vessel; a slow-wave member disposed on the planar antenna member, for shortening a wavelength of a microwave; and a microwave interference restraining part disposed on a lower surface of the top plate, the microwave interference restraining part separating the lower surface into a plurality of concentric zones and restraining a microwave interference between the zones.

13 Claims, 8 Drawing Sheets

U.S. PATENT DOCUMENTS

| | | |
|---|---|---|
| 6,325,018 B1 | 12/2001 | Hongoh |
| 6,622,650 B2 * | 9/2003 | Ishii et al. ............ 118/723 MW |
| 6,796,268 B2 | 9/2004 | Ishii |
| 7,469,654 B2 * | 12/2008 | Ishibashi et al. ...... 118/723 MW |
| 2002/0020498 A1 * | 2/2002 | Ohmi et al. .................... 156/345 |
| 2002/0076367 A1 * | 6/2002 | Hongoh et al. ............... 422/186 |
| 2004/0134613 A1 | 7/2004 | Ohmi et al. |
| 2004/0149741 A1 | 8/2004 | Ishii et al. |

FOREIGN PATENT DOCUMENTS

| | | | |
|---|---|---|---|
| JP | 03-191073 | | 8/1991 |
| JP | 09-181052 | | 7/1997 |
| JP | 2000-268996 | | 9/2000 |
| JP | 2001-223098 | | 8/2001 |
| JP | 2002-355550 | | 12/2002 |
| JP | 2003-059919 | * | 2/2003 |
| JP | 2003-142457 | | 5/2003 |
| JP | 2004-186303 | * | 7/2004 |
| JP | 2004-200307 | | 7/2004 |
| JP | 2005-032805 | | 2/2005 |

OTHER PUBLICATIONS

Notification of Transmittal of Translation of the International Preliminary Report on Patentability (Form PCT/IB/338), Jan. 2004, corresponding to PCT/JP2005/013404.

* cited by examiner

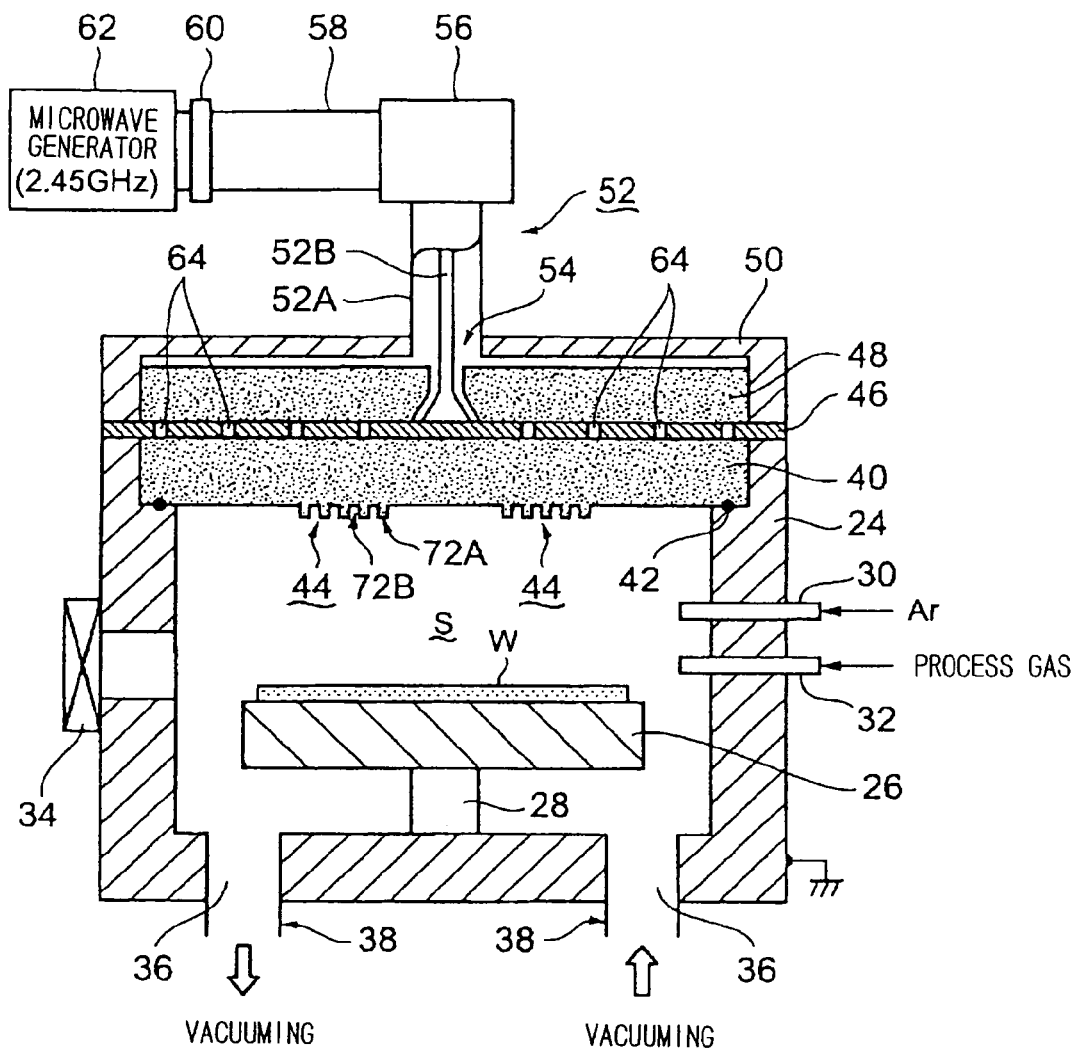
F I G. 1

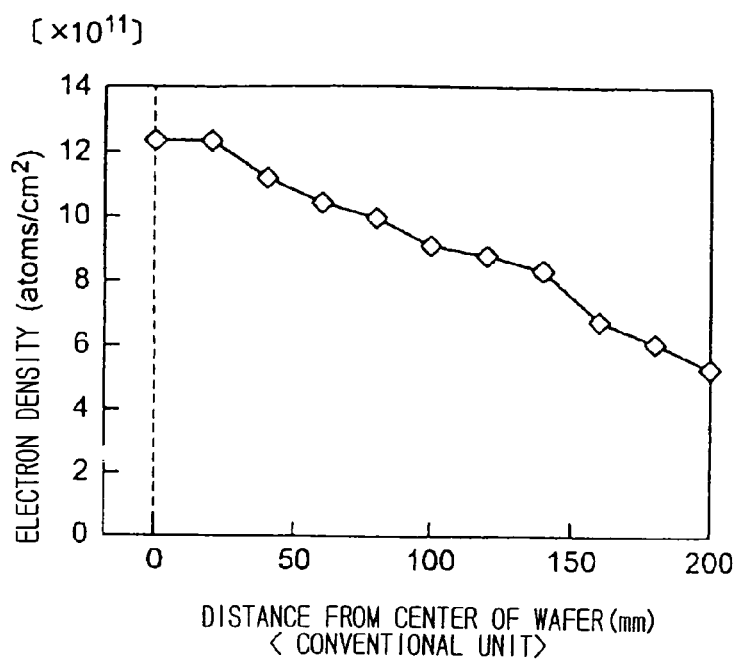
F I G. 5A
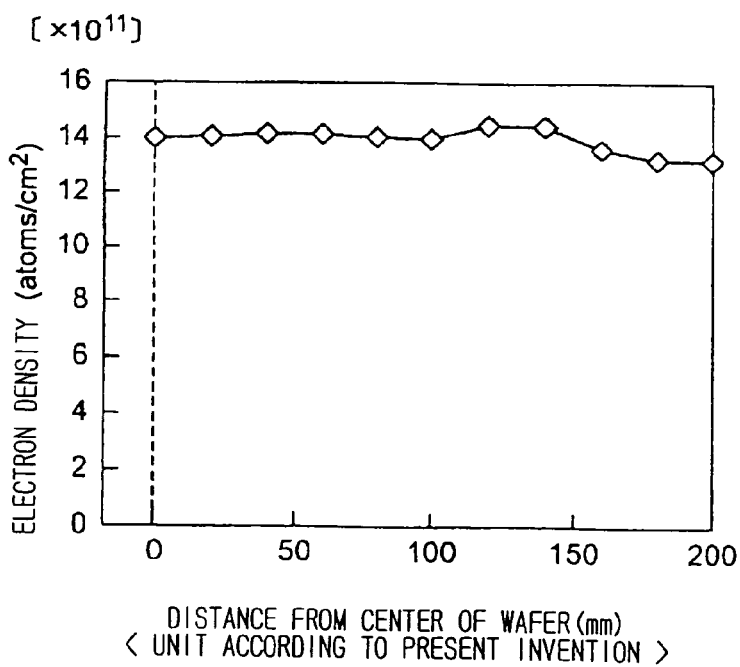
F I G. 5B

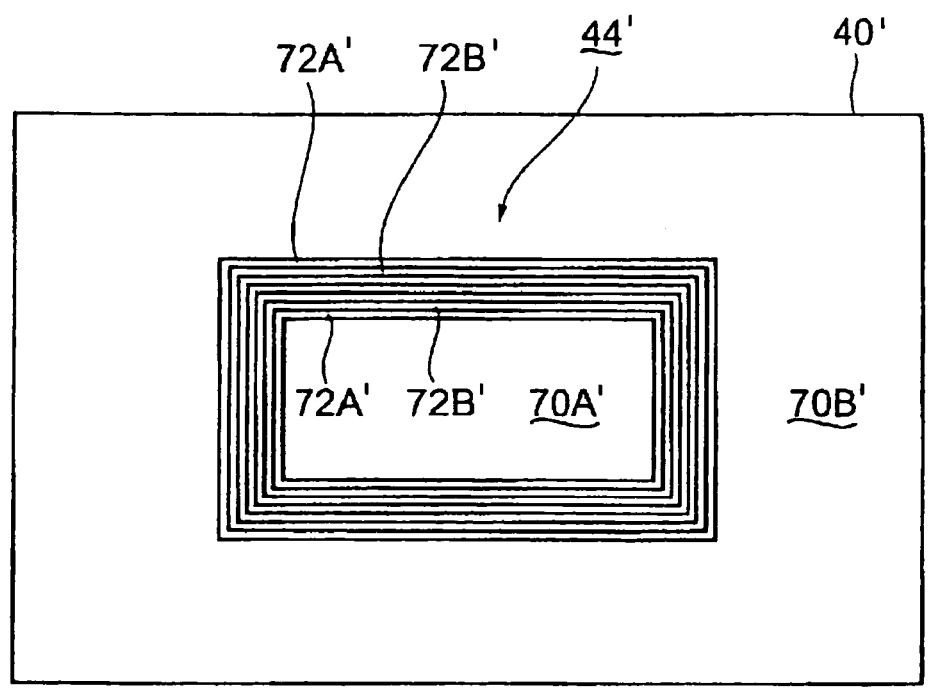
F I G. 8

PLASMA PROCESSING UNIT

FIELD OF THE INVENTION

The present invention relates to a plasma processing unit that processes semiconductor wafers or the like, with the use of a plasma generated by a microwave.

BACKGROUND ART

In recent years, in order to cope with an increased density and further miniaturization of semiconductor products, a plasma processing unit has been used for manufacturing such semiconductor products to perform processes such as a film-deposition process, an etching process, an ashing process, and so on. In particular, there has been a tendency to use a microwave plasma processing unit that generates a high density plasma by means of a microwave, because the microwave plasma processing unit can stably generate a plasma even under a high vacuum state with relatively a low pressure ranging between about 0.1 mTorr (13.3 mPa) and several tens mTorr (some Pa).

Such plasma processing units are disclosed in JP3-191073A, JP5-343334A, and JP9-181052A, for example. A general microwave plasma processing unit is schematically described below with reference to FIG. 9. FIG. 9 is a schematic structural view of a conventional, general microwave plasma processing unit.

As shown in FIG. 9, the plasma processing unit 102 includes a processing vessel 104 capable of creating a vacuum therein, and a stage 106 disposed in the processing vessel 104 to place thereon a semiconductor wafer W. A discoid top plate 108 is hermetically disposed at a ceiling part opposed to the stage 106. The top plate 108 is made of, e.g., aluminum nitride or quartz to allow a microwave to pass therethrough.

A discoid planar antenna member 110 with a thickness of several millimeters is disposed on an upper surface of the top plate 108 or above the same. A slow-wave member 112 made of, e.g., a dielectric is disposed on an upper surface of the planar antenna member 110 or above the same, so as to shorten a wavelength of a microwave in a radial direction of the planar antenna member 110. A ceiling cooling jacket 114 is disposed above the slow-wave member 112. Since the ceiling cooling jacket 114 has therein a cooling-water flow channel through which a cooling water flows, the slow-wave member 112 and the like can be cooled.

The planar antenna member 110 has a number of microwave radiating holes 116 each of which is, for example, a through-hole of an elongated groove shape. Generally, the microwave radiating holes 116 are arranged concentrically or helically. An internal cable 120 of a coaxial waveguide 118 is connected to a center part of the planar antenna member 110. Through the internal cable 120, a microwave of, e.g., 2.45 GHz generated by a microwave generator, not shown, is guided to the planar antenna member 110. The microwave is radially propagated in the radial direction of the antenna member 110, and is discharged from the microwave radiating holes 116 formed in the planar antenna member 110. After passing through the top plate 108, the microwave is introduced into the processing vessel 104. Due to the introduction of the microwave, a plasma is generated in a processing space S in the processing vessel 104, and the semiconductor wafer W on the stage 106 can be subjected to predetermined plasma processes such as an etching process and a film-deposition process.

When a semiconductor wafer is subjected to a plasma process such as a film-deposition process and an etching process by means of the above-described plasma processing unit, uniformity of the process within a surface of the wafer has to be particularly strictly maintained. In general, with a view to making uniform a plasma density in the processing vessel 104, the distribution or shape of the microwave radiating holes 116 formed in the planar antenna member 110 have been changed (adjusted). However, it is significantly difficult to control behavior of the plasma in the processing vessel 104. Even a slight variation in the processing conditions may give rise to a great change in the behavior of the plasma. As a result, there have been cases in which uniformity of the plasma process within a surface of a wafer cannot be sufficiently maintained.

Recently, a size of a wafer has been enlarged, that is, 12 inch wafers have been used in place of 8 inch wafers, and a further miniaturization and a further reduced film-thickness of a wafer have been promoted. Under these circumstances, there is a strong demand for solving the above problem.

SUMMARY OF THE INVENTION

In view of the above problem, the present invention has been made to effectively solve the problem. The object of the present invention is to provide a plasma processing unit that is capable of making more uniform a plasma density in a processing vessel so as to enhance uniformity of a plasma process within a surface of an object to be processed.

As a result of extensive studies about behavior of a plasma in a processing vessel, the present inventor has found that a shape of a top plate in the processing vessel, which may contact a plasma, has a great impact on the behavior of the plasma. The present invention is based on this knowledge.

That is, the present invention is a plasma processing unit comprising: a processing vessel having an opening on a ceiling side thereof, and capable of creating a vacuum therein; a stage disposed in the processing vessel, for placing thereon an object to be processed; a top plate made of a dielectric, the top plate being hermetically fitted in the opening and allowing a microwave to pass therethrough; a planar antenna member disposed on or above the top plate, the planar antenna member being provided with a plurality of microwave radiating holes for radiating a microwave for plasma generation toward an inside of the processing vessel; a slow-wave member disposed on or above the planar antenna member, for shortening a wavelength of a microwave; and a microwave interference restraining part disposed on a lower surface of the top plate, the microwave interference restraining part separating the lower surface into a plurality of concentric zones (a central zone and a or more annular zones outside the central zone) and restraining a microwave interference between the zones.

According to the present invention, due to the provision of the microwave interference restraining part separating the lower surface of the top plate into a plurality of concentric zones and restraining a microwave interference between the zones, uniformity in plasma density in the processing vessel can be improved, so that uniformity of a plasma process within a surface of the object to be processed can be enhanced.

For example, the microwave interference restraining part is of a circular ring shape to separate the lower surface of the top plate into a plurality of concentric ring zones.

In this case, it is preferable that the microwave interference restraining part have an inner diameter within a range from 1.5 to 2.5 times the length of a wavelength λ of a microwave in the slow-wave member.

In addition, it is preferable that the microwave interference restraining part have a plurality of concentric ring ridges formed on the lower surface of the top plate at a predetermined pitch. In this case, it is preferable that the pitch of the ring ridges be within a range from $1/10$ to $1/3$ times the length of a wavelength λ of a microwave in the slow-wave member. In this case, it is preferable that a height of the ridge be within a range from 3 to 10 mm.

In addition, it is preferable that the microwave interference restraining part have a width equal to or smaller than the length of one wavelength λ of a microwave in the slow-wave member.

In addition, it is preferable that the plurality of microwave interference restraining parts be disposed on the lower surface of the top plate with a predetermined gap therebetween. In this case, it is preferable that the gap between the microwave interference restraining parts be equal to or larger than the length of one wavelength λ of a microwave in the slow-wave member.

Alternatively, the microwave interference restraining part is of a rectangular shape, for example.

In this case, it is preferable that the microwave interference restraining part have a plurality of concentric rectangular ridges formed on the lower surface of the top plate at a predetermined pitch. In this case, it is preferable that the pitch of the ridges be within a range from $1/10$ to $1/3$ times the length of a wavelength λ of a microwave in the slow-wave member. In this case, it is preferable that a height of the ridge be within a range from 3 to 10 mm.

In addition, it is preferable that the microwave interference restraining part have a width equal to or smaller than the length of one wavelength λ of a microwave in the slow-wave member.

In addition, it is preferable that the microwave radiating holes be thinly arranged at a central part of the planar antenna member, and be densely arranged at a peripheral part of the planar antenna member. Alternatively, the microwave radiating holes may be uniformly arranged in the overall surface of the planar antenna member.

BRIEF DESCRIPTION OF THE DRAWINGS

FIG. 1 is a structural view of a plasma processing unit in one embodiment according to the present invention;

FIG. 5A is a graph of an electron density distribution in a processing vessel of a conventional unit, and FIG. 5B is a graph of an electron density distribution in a processing vessel of an embodiment according to the present invention;

FIG. 8 is a bottom view of an alternative modification of the top plate; and

BEST MODE FOR CARRYING OUT THE INVENTION

Embodiments of a plasma processing system according to the present invention will be described in detail below with reference to the accompanying drawings.

Figure 2A:
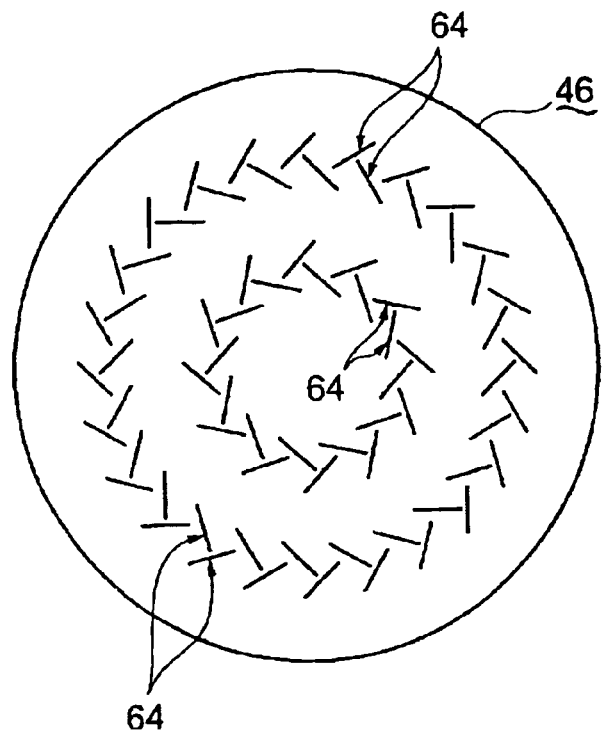
FIGS. 2A and 2B are plan views of examples of a structure of a planar antenna member.
Figure 2B:
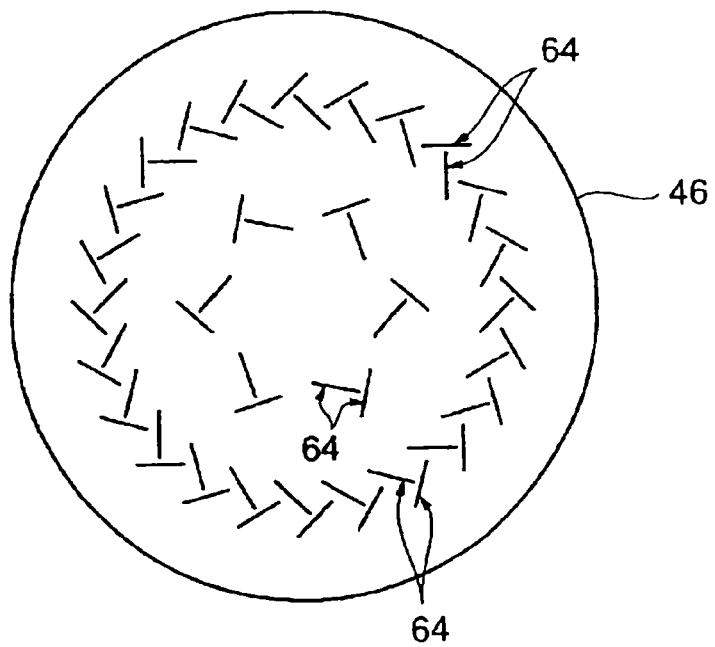
Figure 3:
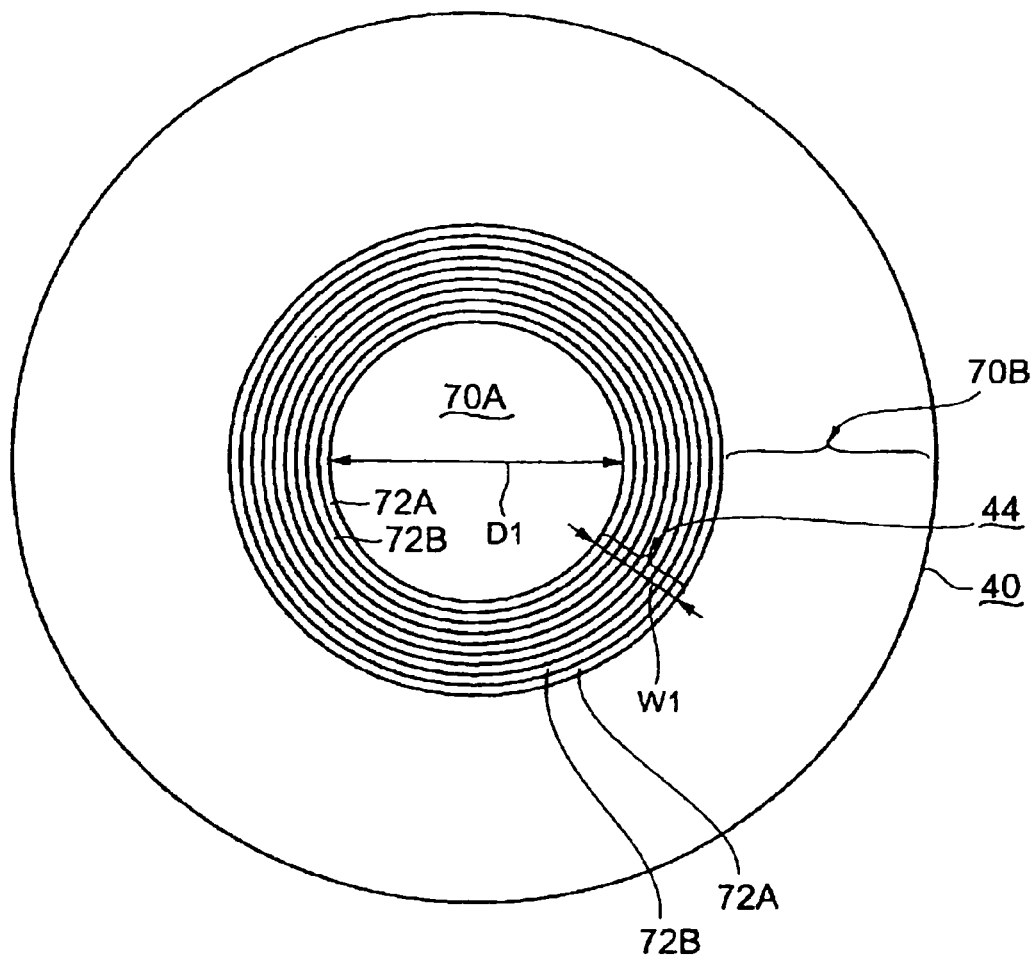
FIG. 3 is a plan view of a lower surface of a top plate of the plasma processing unit shown in FIG. 1.
Figure 4A:
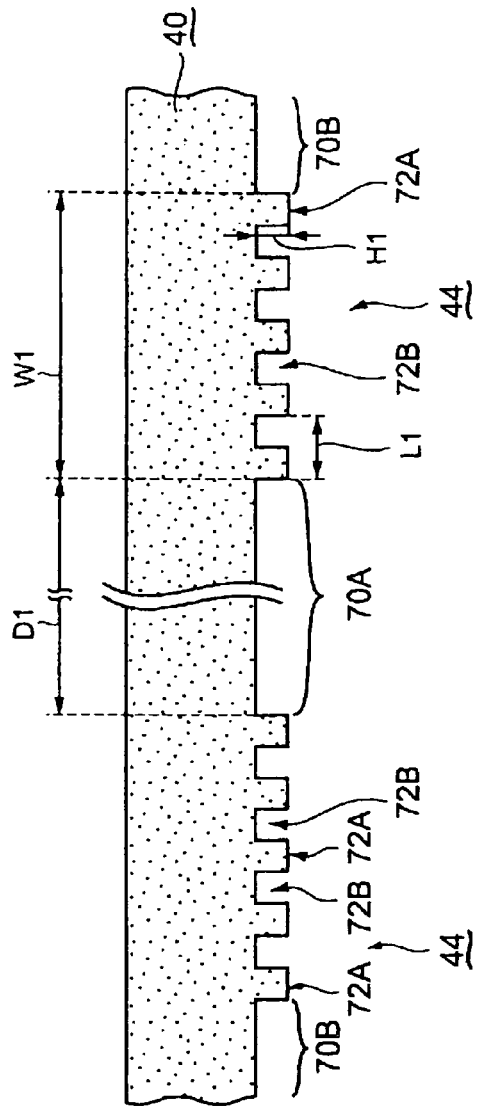
FIGS. 4A and 4B are partially enlarged sectional views of examples of a structure of the top plate.
Figure 4B:
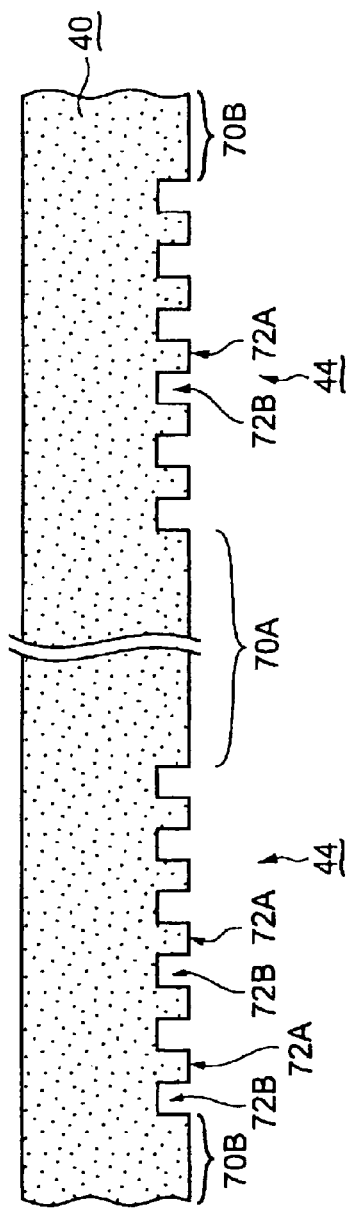

FIG. 1 is a structural view of a plasma processing unit in one embodiment according to the present invention. FIGS. 2A and 2B are plan views of examples of a structure of a planar antenna member. FIG. 3 is a plan view of a lower surface of a top plate of the plasma processing unit shown in FIG. 1. FIGS. 4A and 4B are partially enlarged sectional views of examples of a structure of the top plate.

As shown in FIG. 1, the plasma processing unit 22 in this embodiment includes a processing vessel 24 of a generally cylindrical shape. The processing vessel 24 has a sidewall and a bottom part, which are formed of a conductive material such as aluminum and are grounded. An inside of the processing vessel 24 provides a hermetically sealed processing space S, in which a plasma is generated.

The processing vessel 24 accommodates a stage 26 on which an object to be processed such as a semiconductor wafer W can be placed. The stage 26 is made of anodized aluminum or so, and has a flat discoid shape. The stage 26 is supported by a supporting column 28 made of, e.g., an insulating material which stands from the bottom part of the processing vessel 24.

An electrostatic chuck or a clamping mechanism (not shown) for holding the wafer is disposed on the upper surface of the stage 26. If required, the stage 26 can be connected to a radio-frequency power supply for biasing, which supplies, e.g., 13.56 MHz radio-frequency power. The stage 26 may be provided with a built-in heater, according to need.

A plasma gas supply nozzle 30 serving as a gas supply means made of a quartz pipe is connected to the sidewall of the processing vessel 24. The plasma gas supply nozzle 30 supplies a gas for generating a plasma such as an argon gas into the processing vessel 24. Similarly, a process gas supply nozzle 32 serving as a gas supply means made of, e.g., a quartz pipe is connected to the sidewall of the processing vessel 24. The process gas supply nozzle 32 guides a process gas such as a deposition gas into the processing vessel 24. The respective gases can be fed into the processing vessel 24 through the respective nozzles 30 and 32, while flow rates of the respective gases are controlled.

A gate valve 34 capable of opening and closing is disposed on the sidewall of the processing vessel 24. Through the gate valve 34, wafers are loaded into the processing vessel 24 or unloaded therefrom. A gas-discharging port 36 is formed in the bottom part of the processing vessel 24. A gas-discharging channel 38 provided with a vacuum pump, not shown, is connected to the gas-discharging port 36. Thus, when needed, the inside of the processing vessel 24 can be vacuumed at a predetermined pressure.

A ceiling part of the processing vessel 24 is opened (an opening is formed in the ceiling part). A top plate 40 allowing a microwave to pass therethrough is air-tightly fitted in the opening via a sealing member 42 such as an O-ring. The top plate 40 is made of quartz or ceramic, for example. In order that the top plate 40 has a pressure resistance, a thickness of the top plate 40 is set at about 20 mm, for example. On a lower surface of the top plate 40, there is formed a microwave interference restraining part 44 which is a characteristic feature of the present invention. A structure of the microwave interference restraining part 44 will be described hereinafter.

A discoid planar antenna member 46 and a slow-wave member 48 having a high dielectric constant are arranged in this order from below on an upper surface of the top plate 40. A conductive waveguide box 50 as a hollow cylindrical container is disposed so as to cover almost all the upper and side surfaces of the slow-wave member 48. The planar antenna member 46 serves as a bottom plate of the waveguide box 50.

Peripheral portions of the waveguide box 50 and the planar antenna member 46 are grounded. An external pipe 52A of a coaxial waveguide 52 is connected to a center of an upper surface of the waveguide box 50. An internal cable 52B in the coaxial waveguide 52 extends through a through-hole 54 formed in a center of the slow-wave member 48 to be connected to a center part of the planar antenna member 46.

The coaxial waveguide 52 is connected to a microwave generator 62 having a matching 60 for generating a microwave of, e.g., 2.45 GHz, via a mode converter 56 and a waveguide 58. Thus, the microwave can be propagated toward the planar antenna member 46. The frequency of the microwave is not limited to 2.45 GHz. Other frequency of, for example, 8.35 GHz is possible. The waveguide herein may be a waveguide or coaxial waveguide having a circular cross-section or rectangular cross-section. A ceiling cooling jacket, not shown, may be disposed on or above the waveguide box 50. A function of the slow-wave member 48 having a high dielectric constant, which is disposed in the waveguide box 50 on the upper surface of the planar antenna member 46, is to shorten (reduce) a guide wavelength of the microwave by a wavelength shortening (reduction) effect. For example, aluminum nitride may be used to form the slow-wave member 48.

The planar antenna member 46 suited for an 8 inch wafer is formed of a conductive material having a diameter between 300 mm and 400 mm and a thickness between 1 mm and several mm, for example. More specifically, the planar antenna member 46 may be made of, e.g., a copper plate or aluminum plate with its surface coated with silver. As shown in FIGS. 2A and 2B, the planar antenna member 46 has a large number of microwave radiating holes 64 each of which is, for example, a through-hole of an elongated groove shape. An arrangement manner of the microwave radiating holes 64 is not particularly limited. For example, the microwave radiating holes 64 may be arranged concentrically, helically, or radially. Alternatively, the microwave radiating holes 64 may be uniformly distributed in the overall surface of the planar antenna member 46. FIG. 2A shows an example of arrangement of the microwave radiating holes 64, in which twelve pairs of microwave radiating holes 64, each pair being formed by two holes 64 positioned in "T" shape, are arranged on a central side, and twenty-four pairs of microwave radiating holes 64 are arranged on a peripheral side. That is, the microwave radiating holes 64 are arranged so as to form two concentric circles. FIG. 2B shows another example in which six pairs of holes 64 are arranged on the central side, and twenty-four pairs of holes 64 are arranged on the peripheral side. That is, the microwave radiating holes 64 are thinly arranged on the central side, and densely arranged on the peripheral side. Actually, the arrangement of the microwave radiating holes 64 may be optimally adjusted in response to a shape of the microwave interference restraining part 44.

As described above, the microwave interference restraining part 44 is formed on the lower surface of the top plate 40, i.e., on the surface which may directly contact a plasma in the processing space S. As shown in FIG. 3, the microwave interference restraining part 44 is formed into a circular ring shape in this embodiment. By means of the microwave interference restraining part 44, there are defined two concentric ring zones, i.e., a central zone 70A inside the microwave interference restraining part 44 and a peripheral zone 70B outside the same.

The microwave interference restraining part 44 has a function for restraining a microwave interference between the central zone 70A and the peripheral zone 70B. It should be noted that the microwave interference restraining part 44 does not fully block a microwave interference between the zones 70A and 70B. On the contrary, while allowing a microwave interference between the zones 70A and 70B to a certain degree, the microwave interference restraining part 44 restrains an excessive microwave interference which may occur in a conventional antenna member. It is not preferred to perfectly block a microwave interference between the zones 70A and 70B, because this seriously disbalances electric powers to be supplied to the respective zones 70A and 70B.

For example, as shown in FIG. 4A, the microwave interference restraining part 44 in this embodiment has a plurality of ridges 72A and a plurality of recesses 72B which are concentrically arranged. In the example shown in FIG. 4A, five ridges 72A having a square cross-section are arranged to form concentrically arranged circular rings projecting downward from the lower surface of the top plate 40. It is preferable to form the microwave interference restraining part 44 at a position corresponding to a position near substantially a midpoint part between the center and the outer periphery of the wafer W on the stage 26. In this case, it was found that an inner diameter D1 of the microwave interference restraining part 44 is preferably within a range from 1.5 to 2.5 times the length of a wavelength λ of a microwave of 2.45 GHz in the slow-wave member 48. When the inner diameter D1 is deviated from this range, there is a possibility that electric energy of a microwave to be supplied to the central zone 70A and the peripheral zone 70B are disbalanced.

The ridges 72A and the recesses 72B have substantially the same width to each other. For example, each ridge 72A and each recess 72B are about 5 mm in width. Thus, a pitch L1 of the ridge and recess is about 10 mm. It was found that the pitch L1 of the ridge and recess is preferably within a range from 1/10 to 1/3 times the length of the wavelength λ. When the pitch L1 is deviated from this range, a microwave interference restraining effect between the central zone 70A and the peripheral zone 70B may be nearly nullified, which may invite a more than necessary microwave interference between the zones 70A and 70B. As a result, uniformity in plasma density may be deteriorated.

A height H1 of the ridge 72A (depth of the recess 72B) is preferably in a range of from 3 mm to 10 mm. In this embodiment, the height H1 is, e.g., 5 mm. When the height H1 is deviated from this range, a microwave interference restraining effect between the central zone 70A and the peripheral zone 70B may be nearly nullified, which may invite a more than necessary microwave interference between the zones 70A and 70B. As a result, uniformity in plasma density may be deteriorated.

Further, it was found that, when there is only one ridge 72A, a microwave interference restraining effect between the zones 70A and 70B is insufficient. Thus, the number of the ridges 72A should be two or more. Furthermore, it was found that a width of the overall part where the ridges and recesses are formed, that is, a width W1 of the microwave interference restraining part 44 is preferably equal to or smaller than the length of the wavelength λ. When the width W1 of the microwave interference restraining part 44 is larger than the length of one wavelength λ, the microwave interference restraining effect between the zones 70A and 70B becomes excessive, and hence there is a possibility that electric energy to be respectively supplied to the central zone 70A and the peripheral zone 70B are seriously disbalanced.

In the example shown in FIG. 4A, although a distal end of the ridge 72A projecting downward is positioned lower than a lower surface level of the top plate 40, it is not limited thereto. That is, as shown in FIG. 4B, it is possible to position the distal end of the ridge 72A at the same level as the lower surface level of the top plate 40, by engraving the recesses 72B in the lower surface of the top plate 40. In this case, it is necessary that the number of the recesses 72B is two or more.

Next, a process method performed by the plasma processing unit 22 as structured above will be described below.

At first, the semiconductor wafer W is loaded into the processing vessel 24 by a conveying arm (not shown) via the gate valve 34. By moving a lifter pin (not shown) in an up and down direction, the wafer W is placed on the upper surface of the stage 26.

In maintaining the inside of the processing vessel 24 at a predetermined processing pressure within a range between, e.g., 0.01 Pa to several Pa, an argon gas or the like is supplied from the plasma gas supply nozzle 30 with its flow rate being controlled, while a process gas suitable for the kind of process, that is, a film-deposition gas for a film-deposition process or an etching gas for an etching process, is supplied from the process gas supply nozzle 32 with its flow rate being controlled. At the same time, a microwave generated by the microwave generator 62 is supplied to the planar antenna member 46 through the waveguide 58 and the coaxial waveguide 52. In this manner, a microwave having a wavelength reduced (shortened) by an action of the slow-wave member 48 is introduced into the processing space S where a plasma is then generated. Thus, a predetermined plasma process can be carried out.

The microwave of, e.g., 2.45 GHz generated by the microwave generator 62 is propagated in the coaxial waveguide 52 to reach the planar antenna member 46 in the waveguide box 50, as described above. While the microwave is radially propagated from a center part of the discoid planar antenna member 46 to a peripheral part thereof, the microwave is introduced into the processing space S directly below the planar antenna member 46 from the microwave radiation holes 64 formed in the planar antenna member 46 via (by passing through) the top plate 40. The argon gas is excited by the microwave to generate a plasma, which then diffuses downward, and activates the process gas to form active species. Because of an action of the active species, a surface of the wafer W is subjected to a predetermined plasma process.

Figure 9:
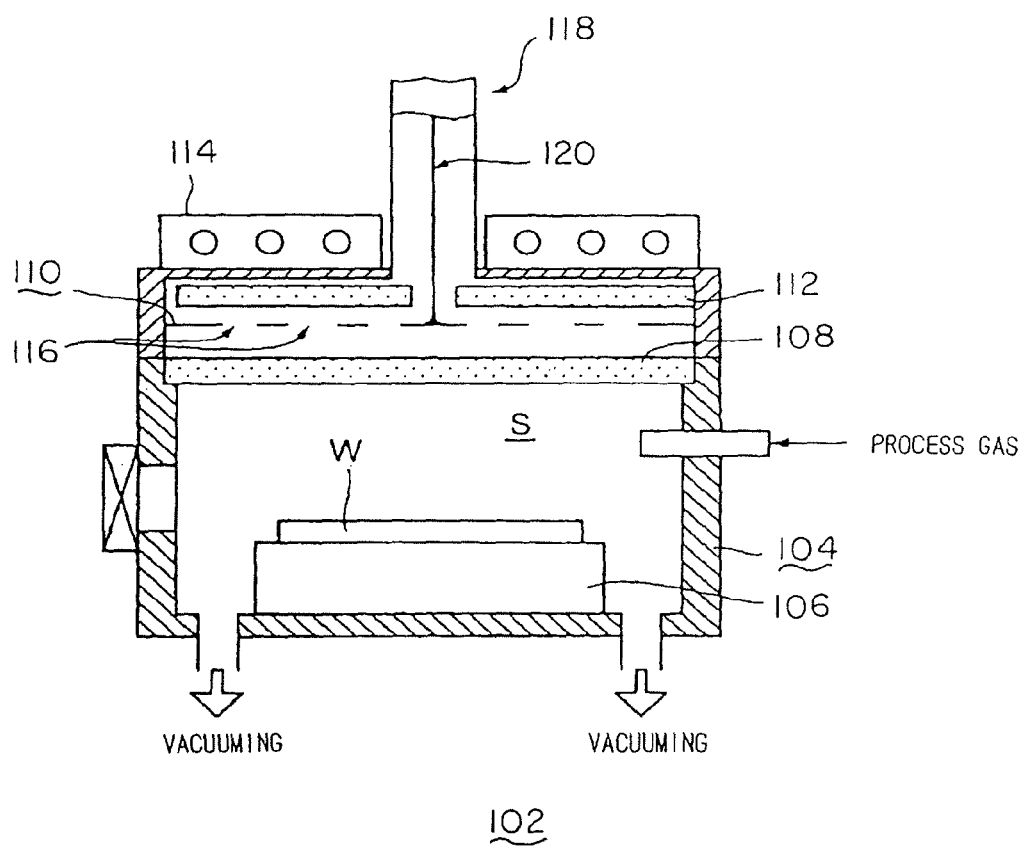
FIG. 9 is a schematic structural view of a conventional plasma processing unit.

When the top plate has a totally flat-shaped surface, as in the conventional unit (see, FIG. 9), an intensive microwave interference occurs in a plane direction of the top plate 108, so that a plasma density in the processing vessel 104 may greatly change by means of a slight variation or the like in process conditions in the processing vessel 104. In this case, uniformity of the plasma process within a surface of the wafer may be deteriorated. Meanwhile, in the unit according to the present invention, owing to the provision of the microwave interference restraining part 44 on the lower surface of the top plate 40 in which the ridges 72A and the recesses 72B are formed at the pitch L1 which is sufficiently shorter than the wavelength $\lambda$, a microwave interference in a plane direction of the top plate 40 can be restrained (the microwave interference is not completely prevented but is restrained to a certain extent). Since the microwave interference between the zones 70A and 70B in the top plate 40 is suitably restrained, uniformity in plasma density in the processing space S can be stabilized. As a result, uniformity of the plasma process within a surface of the wafer can be significantly made stable. More specifically, when a planar antenna member of a conventional structure is used, a plasma density at a center part of the processing space S are prone to be higher than a plasma density at its peripheral part. On the other hand, when the planar antenna member employing the structure of the present invention is used, that is, when there are formed a plurality of ridges 72A and recesses 72B arranged at the pitch L1 sufficiently smaller than the wavelength $\lambda$ of a microwave in the slow-wave member 48 so as to restrain a microwave interference between the zones 70A and 70B, a plasma density can be made uniform in a plane direction of the processing space S.

The reason for the improvement in uniformity in plasma density is considered as follows. That is, a plasma in the processing space S generally has a conductivity. Thus, the higher the plasma density is, the larger a reflective amount of the microwave become. Although a part of the reflected microwave returns to the microwave generator 62 and is adjusted by the matching 60, a large part of the reflected microwave is repeatedly radially reflected in the top plate 40 made of a dielectric and stagnate therein forming a standing wave or the like. In this case, a distribution of the plasma density is correspondent to an intensity distribution of an electric filed in the top plate 40. The intensity distribution of the electric field in the top plate 40 greatly depends on a shape or pattern of the top plate 40 itself. Therefore, by providing the ridges 72A and the recesses 72B on the lower surface of the top plate 40 to change (adjust) the shape of the top plate 40, the intensity distribution of the electric field in a plane direction of the top plate 40 is uniformized. As a result, the plasma distribution is made uniform in the plane direction.

A sample of the unit according to the present invention and a sample of the conventional unit were manufactured, and plasma densities (electron densities) were measured and evaluated. The evaluation results are described below. FIG. 5A is a graph of an electron density distribution in a processing vessel of the sample of the conventional unit. FIG. 5B is a graph of an electron density distribution in a processing vessel of the sample of the unit according to the present invention.

As shown in FIG. 5A, in the sample of the conventional unit, an electron density at a center part of a wafer is considerably high, and the electron density gradually decreases toward a peripheral part of the wafer. On the other hand, as shown in FIG. 5B, in the sample of the unit according to the present invention, an electron density is substantially constant from a center part of a wafer to a peripheral part thereof. In other words, an excellent uniformity in plasma density in a plane direction can be achieved.

In the actual plasma processing unit, by suitably altering the distribution of the microwave radiating holes 64, as shown in FIGS. 2A and 2B, in accordance with the kind of plasma process, for example, the plasma density distribution can be further finely adjusted.

In the above embodiment, quartz is used as a dielectric material of the slow-wave member 48 and the top plate 40. However, not limited to quartz, a ceramic material such as alumina ($Al_2O_3$), aluminum nitride (AlN), and silicon nitride ($Si_3N_4$) may be used.

The frequency of a microwave is not limited to 2.45 GHz, and a frequency in a range, e.g., between several hundreds MHz and 10 GHz may be used.

Figure 6:
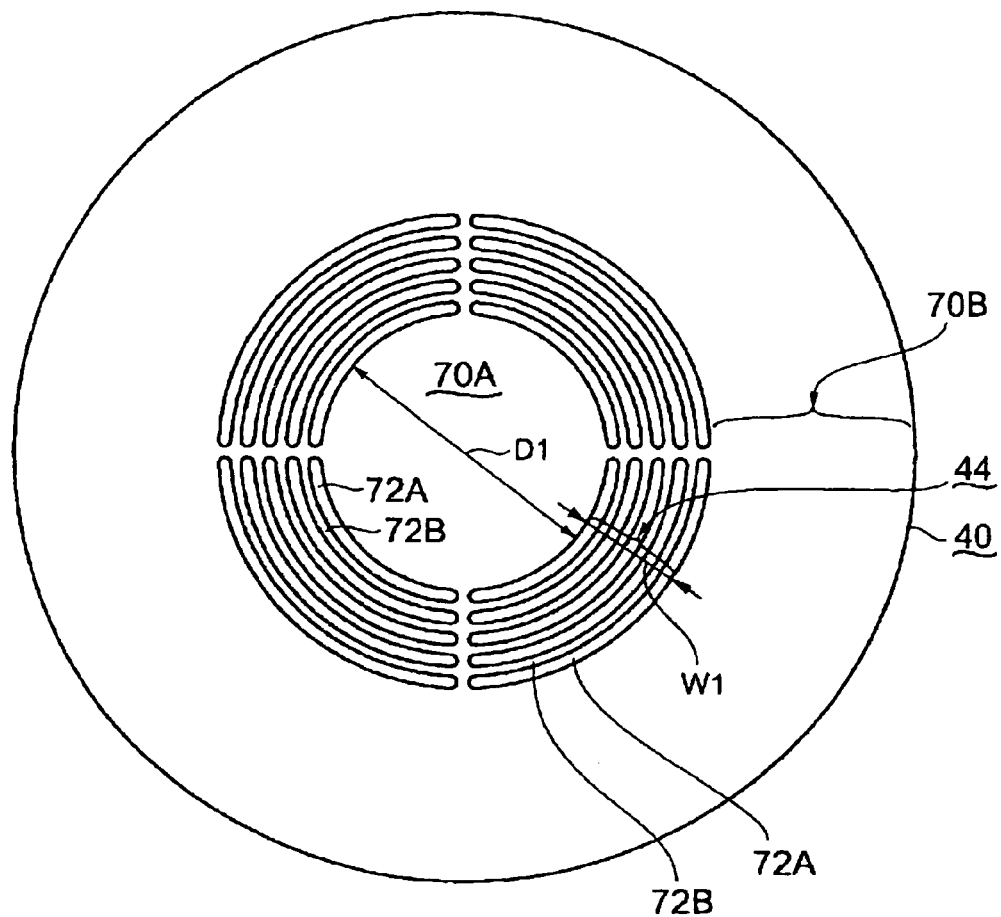
FIG. 6 is a plan view of a modification of a microwave interference restraining part.

In the above embodiment, as shown in FIG. 3, the ridges 72A and the recesses 72B have a full-ring shape. However, their shape is not limited to the full-ring shape. For example, as shown in FIG. 6, the ridges 72A and the recesses 72B may be equally divided into a plurality of, e.g., four arcuate portions, respectively.

In the above embodiment, the top plate 40 is separated into the two zones, i.e., the central zone 70A and the peripheral zone 70B by one microwave interference restraining part 44 of a circular ring shape. However, the present invention is not limited thereto. The top plate 40 may be separated into three or more zones by a plurality of microwave interference restraining parts which are spaced apart from each other with a predetermined interval therebetween.

Figure 7:
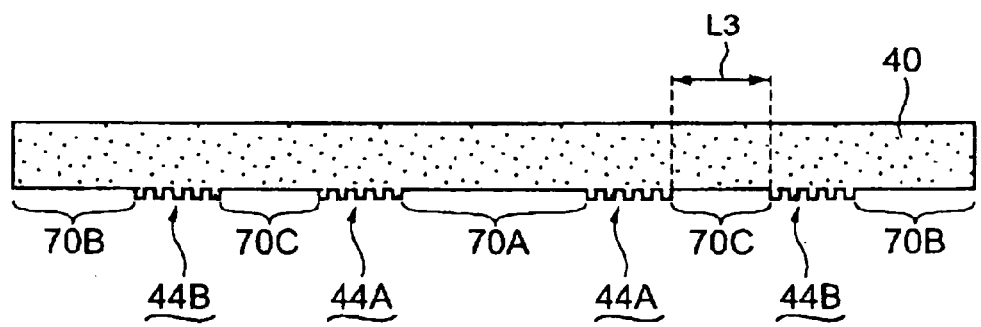
FIG. 7 is a sectional view of a modification of the top plate.

FIG. 7 shows a modification of such a top plate. In this modification, two microwave interference restraining parts 44A and 44B are formed with a predetermined gap L3 therebetween to separate the top plate 40 into three zones, i.e., a central zone 70A, an intermediate zone 70C, and a peripheral zone 70B. In this case, it was found that, the gap between the two microwave interference restraining parts 44A and 44B, that is, the width L3 of the intermediate zone 70C is preferably equal to or larger than the length of one wavelength λ of a microwave in the slow-wave member 48. This structure allows that a plasma density in the intermediate zone 70C is substantially the same as plasma densities in the central zone 70A and the peripheral zone 70B.

In the above embodiment, the top plate 40 is of a discoid shape. However, the present invention is not limited thereto. For example, the present invention can be applied to a top plate of a rectangular shape which is used in a unit adapted for an LCD substrate or the like. FIG. 8 is a bottom view of a modification of such a top plate. A top plate 40' is formed into a rectangular shape in accordance with an LCD substrate, a glass substrate, and so on. A microwave interference restraining part 44' (ridges 72A' and recesses 72B') is also formed into a rectangular loop shape to separate a central zone 70A' and a peripheral zone 70B' from each other.

Needless to say, the above-described structure of the plasma processing unit 22 is merely an example, and the present invention is not limited thereto.

The invention claimed is:

1. A plasma processing unit comprising:
a processing vessel having an opening on a ceiling side thereof, and capable of creating a vacuum therein;
a stage disposed in the processing vessel, for placing thereon an object to be processed;
a top plate made of a dielectric, the top plate being hermetically fitted in the opening and allowing a microwave to pass therethrough;
a planar antenna member disposed on or above the top plate, the planar antenna member being provided with a plurality of microwave radiating holes for radiating a microwave for plasma generation toward an inside of the processing vessel;
a slow-wave member disposed on or above the planar antenna member, for shortening a wavelength of a microwave; and
a microwave interference restraining part disposed on a lower surface of the top plate such that the lower surface of the top plate consists of a flat surface except at the microwave interference restraining part, the microwave interference restraining part separating the lower surface into a plurality of concentric zones, wherein
the microwave interference restraining part consists of three or more concentric ridges having a same cross section and a same predetermined pitch,
the microwave interference restraining part is spaced apart from a periphery of the lower surface of the top plate, toward the center of the lower surface,
the pitch of the three or more concentric ridges is within a range from 1/10 to 1/3 times the length of a wavelength λ of a microwave in the slow-wave member, and the microwave interference restraining part has an inner diameter within a range from 1.5 to 2.5 times the length of the wavelength λ of the microwave in the slow-wave member.

2. The plasma processing unit according to claim 1, wherein
the microwave interference restraining part is of a circular ring shape to separate the lower surface of the top plate into a plurality of concentric ring zones.

3. The plasma processing unit according to claim 2, wherein
the microwave interference restraining part has a plurality of concentric ring ridges formed on the lower surface of the top plate at the predetermined pitch.

4. The plasma processing unit according to claim 3, wherein
a height of the ridge is within a range from 3 to 10 mm.

5. The plasma processing unit according to claim 1, wherein
the microwave interference restraining part has a width equal to or smaller than the length of one wavelength λ of a microwave in the slow-wave member.

6. The plasma processing unit according to claim 1, wherein
a plurality of microwave interference restraining parts are disposed on the lower surface of the top plate with a predetermined gap therebetween.

7. The plasma processing unit according to claim 6, wherein
the gap between the plurality of microwave interference restraining parts is equal to or larger than the length of one wavelength λ of a microwave in the slow-wave member.

8. The plasma processing unit according to claim 1, wherein
the microwave interference restraining part is of a rectangular shape.

9. The plasma processing unit according to claim 8, wherein
the microwave interference restraining part has a plurality of concentric rectangular ridges formed on the lower surface of the top plate at a predetermined pitch.

10. The plasma processing unit according to claim 9, wherein
a height of the ridge is within a range from 3 to 10 mm.

11. The plasma processing unit according to claim 9, wherein
the microwave interference restraining part has a width equal to or smaller than the length of one wavelength λ of a microwave in the slow-wave member.

12. The plasma processing unit according to claim 1, wherein
the microwave radiating holes are thinly arranged at a central part of the planar antenna member, and are densely arranged at a peripheral part of the planar antenna member.

13. The plasma processing unit according to claim 1, wherein
the microwave radiating holes are uniformly arranged in the overall surface of the planar antenna member.

* * * * *